United States Patent
Mattix (10) Patent No.: US 7,402,758 B2
(45) Date of Patent: Jul. 22, 2008

(54) TELESCOPING BLIND VIA IN THREE-LAYER CORE

(75) Inventor: Dwight W. Mattix, El Cajon, CA (US)

(73) Assignee: QUALCOMM Incorporated, San Diego, CA (US)

( * ) Notice: Subject to any disclaimer, the term of this patent is extended or adjusted under 35 U.S.C. 154(b) by 440 days.

(21) Appl. No.: 10/683,641

(22) Filed: Oct. 9, 2003

(65) Prior Publication Data
US 2005/0077083 A1 Apr. 14, 2005

(51) Int. Cl.
*H01R 12/04* (2006.01)
*H05K 1/11* (2006.01)
*H05K 3/02* (2006.01)
*H05K 3/10* (2006.01)
*B21B 15/00* (2006.01)
*B21D 39/03* (2006.01)
*B23P 23/04* (2006.01)
*B23P 25/00* (2006.01)

(52) U.S. Cl. ............ 174/262; 361/792; 29/33 R; 29/650; 29/738; 29/846; 29/849

(58) Field of Classification Search ......... 174/262–266; 361/792–795; 29/33 R, 650, 738, 846, 849
See application file for complete search history.

(56) References Cited

U.S. PATENT DOCUMENTS

| | | | |
|---|---|---|---|
| 3,471,631 A | 10/1969 | Quintana | 174/68.5 |
| 5,347,712 A | 9/1994 | Yasuda et al. | 29/852 |
| 5,846,097 A | 12/1998 | Marian, Jr. | 439/289 |
| 5,928,005 A * | 7/1999 | Li et al. | 439/82 |
| 6,329,610 B1 * | 12/2001 | Takubo et al. | 174/264 |
| 6,548,767 B1 | 4/2003 | Lee et al. | 174/262 |
| 6,972,382 B2 * | 12/2005 | Zollo et al. | 174/262 |
| 2001/0020548 A1* | 9/2001 | Burgess | 174/262 |
| 2002/0117761 A1* | 8/2002 | Zohni | 257/774 |
| 2005/0039948 A1* | 2/2005 | Asai et al. | 174/262 |

FOREIGN PATENT DOCUMENTS

| | | |
|---|---|---|
| EP | 1406477 | 4/2004 |
| JP | 11261236 | 9/1999 |
| JP | 2003031952 | 1/2003 |

* cited by examiner

*Primary Examiner*—Jeremy C Norris
(74) *Attorney, Agent, or Firm*—Howard H. Seo; William Marcus Hooks; Thomas R. Rouse (57) ABSTRACT

A multilayer PCB including at least one carrier, wherein the at least one carrier comprises a pseudo three-layer core. Each three-layer core includes a first metal layer, a first dielectric layer, an internal bridge layer, a second dielectric layer, and a second metal layer. The bridge layer includes a plurality of bridge pads. Each carrier includes a plurality of interlayer interconnection units for interconnecting the first and second metal layers. Each interlayer interconnection unit comprises a pair of opposed blind vias and a bridge pad disposed between, and in electrical contact with, the pair of blind vias.

28 Claims, 9 Drawing Sheets

(PRIOR ART)

TELESCOPING BLIND VIA IN THREE-LAYER CORE

BACKGROUND OF THE INVENTION

The present invention generally relates to printed circuit boards, and more particularly to multilayer printed circuit boards comprising a three-layer core having a dual blind via interlayer interconnection unit. The present invention also relates to methods for forming a three-layer core of a multilayer printed circuit board.

The present trend in the design and manufacture of printed circuit boards (PCBs) is towards decreased size, smaller hole or via diameter, and higher interconnection density. High interconnection densities require multilayer PCBs having more than one signal layer with numerous interconnections therebetween.

Each signal layer of prior art multilayer PCBs typically consists of a patterned conductive metal layer. Adjacent conductive layers are separated by an insulating material or dielectric layer comprising, for example, a polyimide or a resin which may be reinforced with glass fiber. Interconnections between the various conductive layers are provided by holes or vias that extend through the intervening dielectric layer, wherein the vias or holes are plated, filled, and/or plated over with conductive material. Such vias or holes may be through holes, blind vias, or buried vias. Through holes extend to all conductive layers of a multilayer assembly. In contrast, blind vias and buried vias pass through only part of a PCB—blind vias having one end of the via exposed, and buried vias having neither end of the via exposed. Thus, a blind via connects two or more layers of a PCB and starts on an outer layer, but does not pass completely through the PCB. A buried via connects two or more inner layers of a PCB but no outer layer.

Two-layer cores, which consist of a thin dielectric layer covered with copper foil, form the basic building block of prior art PCBs. Typically, the dielectric layer of a two-layer core is covered with copper foil on both sides. Multilayer PCBs of the prior art may be formed by laminating two or more two-layer cores. After patterning the copper foil of the signal layers, the layers are laminated using heat and pressure. Plated via holes for interlayer connection may be formed by drilling in the z-axis between layers, e.g., by laser drilling, followed by plating the hole. A blind via may be formed by drilling partly through one or more dielectric layers, followed by plating the hole, or by forming a plated through hole and then laminating an additional layer on one side thereof. A buried via may be formed by forming a blind via and laminating an additional layer on the exposed end of the blind via, or by providing a plated through hole and laminating an additional layer on each side of the plated through hole. Such procedures or processes are well known in the art.

As noted above, the standard building block of prior art PCBs is a core consisting of a two-layer dielectric carrier. Stacking a μvia on either side of such a carrier requires a solid target pad for laser ablating down to (or building up from with additive technology) the top of the carrier's buried via. This requires creating either a solid copper through via, or a via that is filled and plated over in the carrier. Creation of such vias becomes problematic as via size and dielectric thickness decrease. In order to form a large enough via in the carrier to drill and fill effectively, the minimum producible drill-to-adjacent-feature spacing cannot be maintained. Likewise, filling a through via on a thin carrier has limited producibility due to limitations of via fill and plating processes related to decreased carrier thickness. Also, restrictions on high aspect ratio of the filled hole effectively limit the thickness of the carrier's dielectric layer. However, in certain situations a thicker dielectric layer might be required, e.g., for impedance purposes, or for overall finished dimensions of the PCB. Furthermore, thin dielectric layers, which may be required to maintain a minimum aspect ratio for μvias formed therein, may lack the necessary dimensional stability for processing, e.g., filling a plated hole, which may result in destruction of the carrier.

In addition, filling a via of the prior art usually requires multiple plating cycles, and consequently may result in unacceptably thick total surface copper for etching fine features on a signal layer. Consequently, a significant portion of the total surface copper may have to be removed by mechanical means during processing according to the prior art.

Figure 1A:
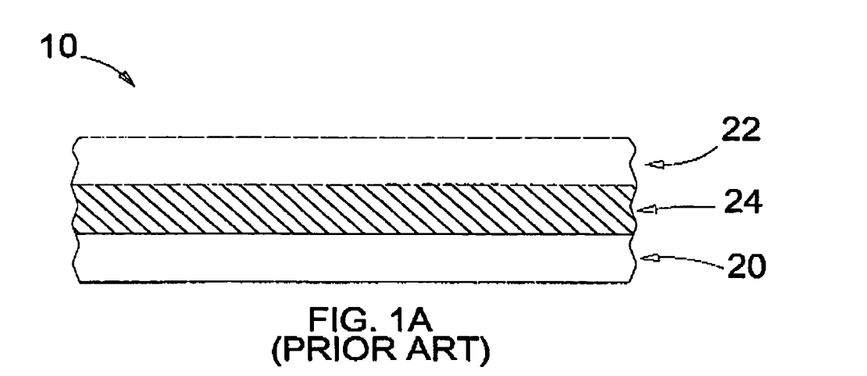
FIG. 1A is a cross-sectional view of a copper clad dielectric layer for processing into a conventional two-layer carrier for a printed circuit board (PCB), according to the prior art.

FIG. 1A is a cross-sectional view of a copper clad dielectric layer 10 for processing into a conventional two-layer carrier for a PCB, according to the prior art. Copper clad dielectric layer 10 includes a first copper layer 20, a second copper layer 22, and a dielectric layer 24 disposed between first and second copper layers 20, 22. Dielectric layer 24 may comprise a dielectric material, such as a glass fiber reinforced resin, or a polyimide, and the like.

Figure 1B:
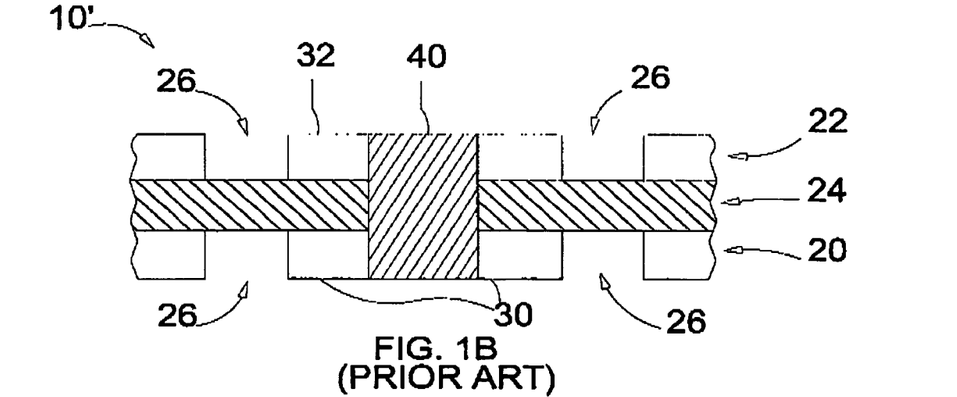
FIG. 1B is a cross-sectional view of a conventional carrier for a PCB in the form of a two-layer core having a plated through hole therein, also according to the prior art.

FIG. 1B is a cross-sectional view of a conventional carrier 10' for a PCB in the form of a two-layer core, according to the prior art. Carrier 10' has two metal layers, namely a first copper layer 20 and a second copper layer 22, as well as a dielectric layer 24 disposed between first and second copper layers 20, 22. Carrier 10' includes a plated through hole 40 which has been filled and plated over. Plated through hole 40 extends from a first pad 30 within first copper layer 20 to a second pad 32 within second copper layer 22. Plated through hole 40 serves as a conducting interconnection-between first and second copper layers 20, 22. Such plated through holes are well known in the art. Regions of the prior art two-layer core that lack first and second copper layers 20, 22, e.g., due to etching thereof, are represented by reference numeral 26.

Figure 1C:
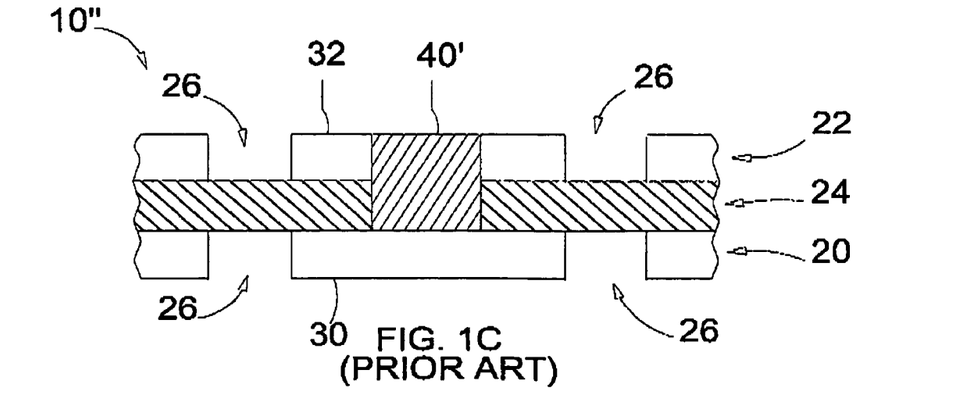
FIG. 1C is a cross-sectional view of a conventional carrier for a PCB in the form of a two-layer core having a blind via therein, also according to the prior art.

FIG. 1C is a cross-sectional view of a conventional carrier 10" for a PCB in the form of a two-layer core, also according to the prior art. Carrier 10" includes a dielectric layer 24 disposed between first and second copper layers 20, 22, essentially as described for FIG. 1B. FIG. 1C shows a blind via 40' which has been filled and plated over. Blind via 40' extends from a first pad 30 within first copper layer 20 to a second pad 32 within second copper layer 22. Blind via 40' serves as a conducting interconnection between different layers of a multilayer PCB, e.g., between first and second copper layers 20, 22. Such blind vias are well known in the art. Regions of prior art carrier 10" that lack first and second copper layers 20, 22, e.g., due to etching thereof, are represented by reference numeral 26.

As noted hereinabove, conventional two-layer cores of the prior art have a number of drawbacks and disadvantages. As an example, as hole size (e.g., via diameter) diminishes to accommodate higher interconnect densities, dielectric thickness must also decrease in order to maintain a certain minimum aspect ratio for the hole, since holes having aspect ratios below the producible minimum cannot be filled efficiently or reliably. Restrictions on dielectric thickness, in turn, are associated with a number of other disadvantages. However, dielectrics below a certain thickness cannot be processed reliably, leading to destruction of many incipient cores and poor processing efficiency. For example, increased dielectric thickness may be required for impedance purposes. Furthermore, a PCB having a relatively large overall dielectric thickness may offer advantages for providing connections thereto.

In addition, increased overall dielectric thickness may allow for production of a PCB having a greater overall finished thickness, for example, to fit within a particular housing of an instrument, device, or appliance.

As can be seen, there is a need for a multilayer PCB having an interlayer interconnection unit, the formation of which requires only a single plating cycle. The use of only a single plating cycle can result in decreased thickness of total surface copper, thereby facilitating formation of fine features without the need for mechanical reduction of the surface copper layer. There is also a need for a dual via interlayer interconnection unit for a multilayer PCB, wherein the interconnection unit allows an overall increased aspect ratio, as compared with prior art plated through holes and vias. There is a further need for a PCB core or subassembly wherein the total thickness of the dielectric, at minimum hole and pad diameter, can be increased when greater dielectric thickness is required, for example, for impedance purposes or for overall finished thickness.

SUMMARY OF THE INVENTION

In one aspect of the present invention, an interlayer interconnection unit for a multi-layer printed circuit board (PCB) comprises an interstitial bridge pad having a first side and a second side, wherein the interstitial bridge pad is disposed between a first dielectric layer and a second dielectric layer; a first blind via disposed on the first side of the interstitial bridge pad, wherein the first blind via extends through the first dielectric layer; and a second blind via disposed on the second side of the interstitial bridge pad, wherein the second blind via extends through the second dielectric layer.

In another aspect of the present invention, an interlayer interconnection unit for a multi-layer PCB comprises a first capture pad having a first annular ring; a first via having a first via inner end and a first via outer end, with the first via outer end in contact with the first capture pad and encircled by the first annular ring; an interstitial bridge pad having a first side and a second side, with the first via inner end in contact with the first side of the interstitial bridge pad; a second via having a second via inner end and a second via outer end, with the second via inner end in contact with the second side of the interstitial bridge pad; and a second capture pad having a second annular ring, with the second via outer end in contact with the second capture pad and encircled by the second annular ring.

In yet another aspect of the present invention, a dual blind via interconnection unit for a multilayer PCB comprises a pair of opposed coaxial blind vias; and a bridge pad disposed between the pair of blind vias, wherein each of the pair of blind vias is in contact with the bridge pad.

In still another aspect of the present invention, a carrier for a multi-layer PCB comprises a pseudo three-layer core. The pseudo three-layer core includes a first metal layer, a first dielectric layer disposed on the first metal layer, a bridge layer disposed on the first dielectric layer, a second dielectric layer disposed on the bridge layer, and a second metal layer disposed on the second dielectric layer. The bridge layer comprises a plurality of spaced apart interstitial bridge pads, and each of the plurality of interstitial bridge pads is adapted for providing an interlayer interconnection between the first metal layer and the second metal layer.

In a further aspect of the present invention, a pseudo three-layer core for a PCB may comprise a plurality of interlayer interconnection units, wherein each of the interlayer interconnection units extends from a first metal layer to a second metal layer; a first dielectric layer disposed on the first metal layer; a bridge layer disposed on the first dielectric layer; and a second dielectric layer disposed on the bridge layer, wherein the second metal layer is disposed on the second dielectric layer. Each of the interlayer interconnection units may comprise an interstitial bridge pad located within the bridge layer, a first blind via extending from the first metal layer to a first side of the interstitial bridge pad, and a second blind via extending from the second metal layer to a second side of the interstitial bridge pad.

In yet a further aspect of the present invention, a multilayer PCB comprises a first signal layer; a second signal layer; a bridge layer disposed between the first signal layer and the second signal layer; and a plurality of interlayer interconnection units. Each of the interlayer interconnection units may be adapted for connecting the first signal layer with the second signal layer through the bridge layer.

In still a further aspect of the present invention, a multilayer PCB comprises at least one pseudo three-layer core. Each pseudo three-layer core may include a first metal layer, a first dielectric layer disposed on the first metal layer, a bridge layer disposed on the first dielectric layer, a second dielectric layer disposed on the bridge layer, a second metal layer disposed on the second dielectric layer, and a plurality of interlayer interconnection units. Each of the interlayer interconnection units may comprise an interstitial bridge pad having a first side and a second side, a first blind via disposed on the first side of the interstitial bridge pad, and a second blind via disposed on the second side of the interstitial bridge pad.

In an additional aspect of the present invention, a multilayer PCB may comprise a means for carrying a plurality of signal layers; and a plurality of means for interconnecting at least two of the signal layers, wherein the carrying means comprises a pseudo three-layer core, wherein the pseudo three-layer core includes an internal bridge layer, wherein the bridge layer comprises a plurality of interstitial bridge pads, and wherein each of the interconnecting means comprises a pair of opposed blind vias disposed on either side of each of the interstitial bridge pads.

In yet an additional aspect of the present invention, a method for forming a multilayer PCB comprises providing a metal clad first dielectric layer having a first metal clad side and a second metal clad side; forming a bridge layer from the second metal clad side, wherein the bridge layer comprises a plurality of bridge pads, and wherein the first metal clad side comprises a first metal layer; providing a second dielectric layer on the bridge layer, wherein the second dielectric layer has a second metal layer disposed thereon; forming a plurality of first blind vias through the first dielectric layer, with the plurality of first blind vias extending from the first metal layer to a first side of each of the plurality of bridge pads; and forming a plurality of second blind vias through the second dielectric layer, with the plurality of second blind vias extending from the second metal layer to a second side of each of the plurality of bridge pads.

In still a further aspect of the present invention, a method for forming a multilayer PCB comprises forming a pseudo three-layer core, wherein the pseudo three-layer core includes a first metal layer, a first dielectric layer disposed on the first metal layer, a bridge layer disposed on the first dielectric layer, a second dielectric layer disposed on the bridge layer, and a second metal layer disposed on the second dielectric layer, wherein the bridge layer comprises a plurality of spaced apart interstitial bridge pads. The method further comprises forming a plurality of interlayer interconnection units for interconnecting the first metal layer and the second metal layer, wherein each of the interlayer interconnection units includes a first blind via disposed on a first side of one of the plurality of interstitial bridge pads, wherein the first blind via extends from the first metal layer through the first dielectric layer; and a second blind via disposed on a second side of one of the plurality of interstitial bridge pads, wherein the second blind via extends from the second metal layer through the second dielectric layer.

In yet an additional aspect of the present invention, a method for forming a multilayer PCB comprises a step for forming a pseudo three-layer core, wherein the pseudo three-layer core includes a first metal layer, a first dielectric layer disposed on the first metal layer, a bridge layer disposed on the first dielectric layer, a second dielectric layer disposed on the bridge layer, and a second metal layer disposed on the second dielectric layer, wherein the bridge layer comprises a plurality of bridge pads. The method further comprises a step for forming a plurality of interlayer interconnection units for interconnecting the first metal layer and the second metal layer, wherein each of the interlayer interconnection units includes a first blind via disposed on a first side of one of the plurality of interstitial bridge pads, wherein the first blind via extends from the first metal layer through the first dielectric layer, and a second blind via disposed on a second side of one of the plurality of interstitial bridge pads, wherein the second blind via extends from the second metal layer through the second dielectric layer.

In still another aspect of the present invention, a method for forming a pseudo three-layer core for a PCB comprises providing a first metal layer; providing a first dielectric layer on the first metal layer; forming a bridge layer on the first dielectric layer, wherein the bridge layer comprises a plurality of bridge pads; providing a second dielectric layer on the bridge layer; providing a second metal layer on the second dielectric layer; forming a first blind via on a first side of each of the plurality of bridge pads, wherein the first blind via extends from the first metal layer through the first dielectric layer; and forming a second blind via on a second side of each of the plurality of bridge pads, wherein the second blind via extends from the second metal layer through the second dielectric layer.

These and other features, aspects, and advantages of the present invention will become better understood with reference to the following drawings, description, and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Generally, the present invention provides a carrier for a multilayer printed circuit board (PCB) or printed wiring board, wherein the carrier may include a novel interlayer interconnection unit for interconnecting a plurality of conductive layers of the multilayer PCB. A basic carrier, subassembly, or building block according to one embodiment of the invention may comprise a pseudo three-layer core. Each pseudo three-layer core may comprise two signal layers for a multilayer PCB, wherein the two signal layers are interconnected through an interconnection unit comprising an internal bridge layer disposed between the two signal layers.

A pseudo three-layer core of the present invention may have additional layers added thereto. For example, a multilayer PCB of the invention may comprise a single pseudo three-layer core, and up to six (6) or more conductive layers. A plurality of carriers may be combined, e.g., laminated together, to form a multilayer PCB having up to about 28 or more signal layers. Multilayer PCBs find almost universal applications in electrical or electronic devices, instruments, and appliances.

In contrast to a conventional two-layer core of the prior art, for example, as described hereinabove with reference to FIGS. 1B-C, in one embodiment the present invention provides a carrier having two dielectric layers, a bridge layer disposed between the two dielectric layers, and a pair of external conductive layers. As compared with carriers of the present invention, prior art carriers, i.e., two-layer cores of prior art multilayer PCBs, have only a single dielectric layer and lack a bridge layer. As compared with prior art multilayer PCBs which have a carrier comprising a two-layer core in which a single dielectric layer is disposed between two conductive layers, multilayer PCBs of the present invention have a carrier comprising a three-layer core, or pseudo three-layer core, including a pseudo metal layer or bridge layer disposed between two dielectric layers.

The bridge layer of carriers of the present invention may be referred to as a pseudo metal layer in that the bridge layer is not a metal layer of the type encountered in prior art carriers, for example, due to the lack of electrical connectivity within the bridge layer between the metal bridge pads that constitute the bridge layer. Due to the presence of the internal pseudo metal (bridge) layer in carriers of the present invention, the basic carrier of the invention, which may comprise the bridge layer, the two dielectric layers, and the pair of external conductive layers, may be referred to as a pseudo three-layer core. The pair of outer conductive layers may be interconnected by a plurality of interlayer interconnection units, wherein each interconnection unit may comprise an interstitial bridge pad located within the bridge layer, and a pair of coaxial, opposed blind vias disposed on either side of the interstitial bridge pad.

In some embodiments of the present invention, a pseudo three-layer core of the invention may itself constitute a multilayer PCB. In other embodiments of the invention, additional dielectric layers and additional conductive (e.g., signal) layers may be sequentially laminated to the pseudo three-layer core. Furthermore, two or more pseudo three-layer cores of the present invention, with or without additional dielectric and conductive layers, may be laminated to each other to form multilayer PCBs having up to 28 or more signal layers.

Figure 2:
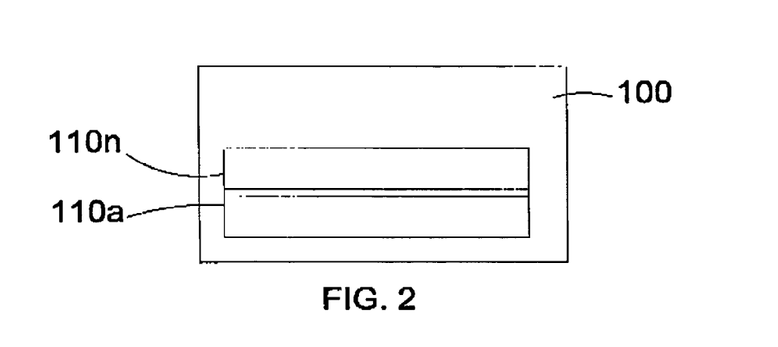
FIG. 2 is a block diagram schematically representing a multilayer PCB having at least one carrier comprising a pseudo three-layer core, according to one embodiment of the present invention.
Figure 6:
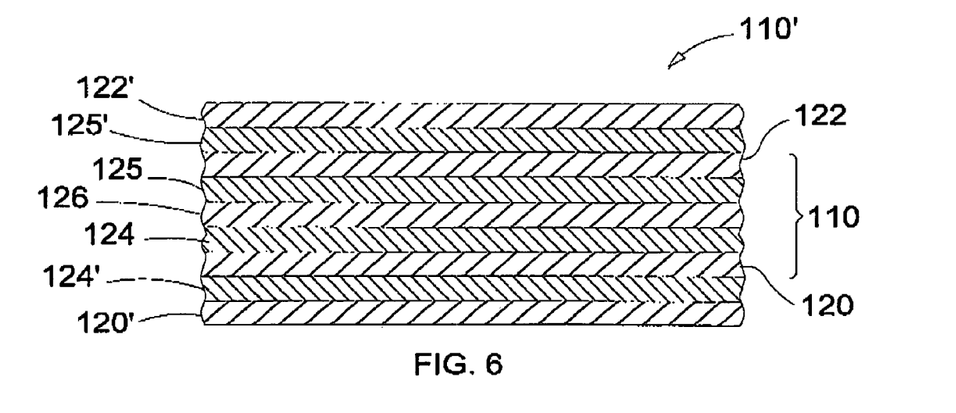
FIG. 6 schematically represents a carrier for a multilayer PCB having additional conductive layers on a pseudo three-layer core, according to one embodiment of the present invention.

FIG. 2 is a block diagram schematically representing a multilayer PCB 100, according to one embodiment of the present invention. Multilayer PCB 100 may include a first carrier or core 110a. In some embodiments, multilayer PCB 100 may further include one or more additional carriers 110n. The one or more additional carriers 110n may be laminated to first carrier 110a. Each of first carrier 110a and additional carrier(s) 110n may comprise a pseudo three-layer core of the present invention. Each pseudo three-layer core may comprise two signal layers. Such a pseudo three-layer core is described fully hereinbelow, for example, with respect to FIGS. 4A-B. In some embodiments, one or more of first carrier 110a and additional carriers 110n may further comprise one or more additional signal layers 120', 122' (FIG. 6).

Figure 3:
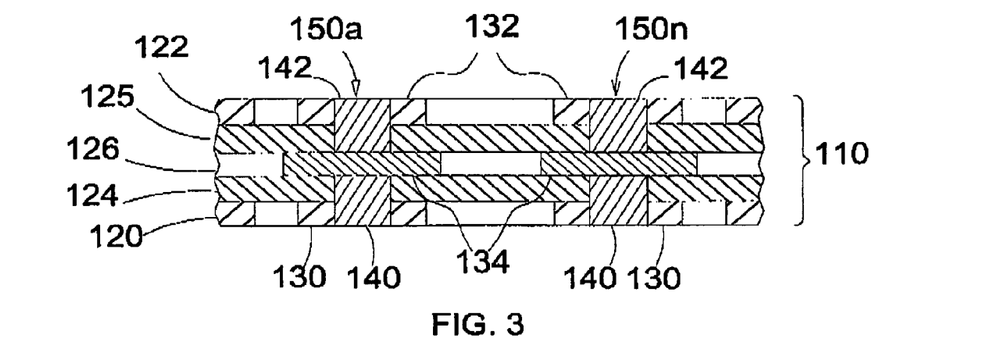
FIG. 3 schematically represents a plurality of interlayer interconnection units within a portion of a pseudo three-layer core, as seen in sectional view, according to one embodiment of the present invention.

FIG. 3 is a sectional view showing a plurality of interlayer interconnection units within a portion of a pseudo three-layer core 110, according to an embodiment of the present invention. Pseudo three-layer core 110 may include a first interlayer interconnection unit 150a, and an $n^{th}$ interlayer interconnection unit 150n. Pseudo three-layer core 110 may include a first metal layer 120, a first dielectric layer 124 disposed on first metal layer 120, a bridge layer 126 disposed on first dielectric layer 124, a second dielectric layer 125 disposed on bridge layer 126, and a second metal layer 122 disposed on second dielectric layer 125. Each of interlayer interconnection units 150a and 150n extend from first metal layer 120, through bridge layer 126, to second metal layer 122. For the purpose of clarity, only two interconnection units 150a, 150n are shown in FIG. 3. In practice, pseudo three-layer core 110 may include any number of interlayer interconnection units. Typically, interlayer interconnection units 150a, 150n may be present only at locations, with respect to the x and y dimensions of a PCB, at which it is desired to interconnect first metal layer 120 to second metal layer 122. Locations at which interlayer interconnection units 150a, 150n may be present correspond to the locations of bridge pads 134. Such locations of bridge pads 134 are schematically represented in FIG. 5. The x and y dimensions are shown in FIG. 5 by the arrows labeled "x" and "y" respectively. Interlayer interconnection units of the present invention are further described hereinbelow, e.g., with reference to FIGS. 4A-B.

Figure 4A:
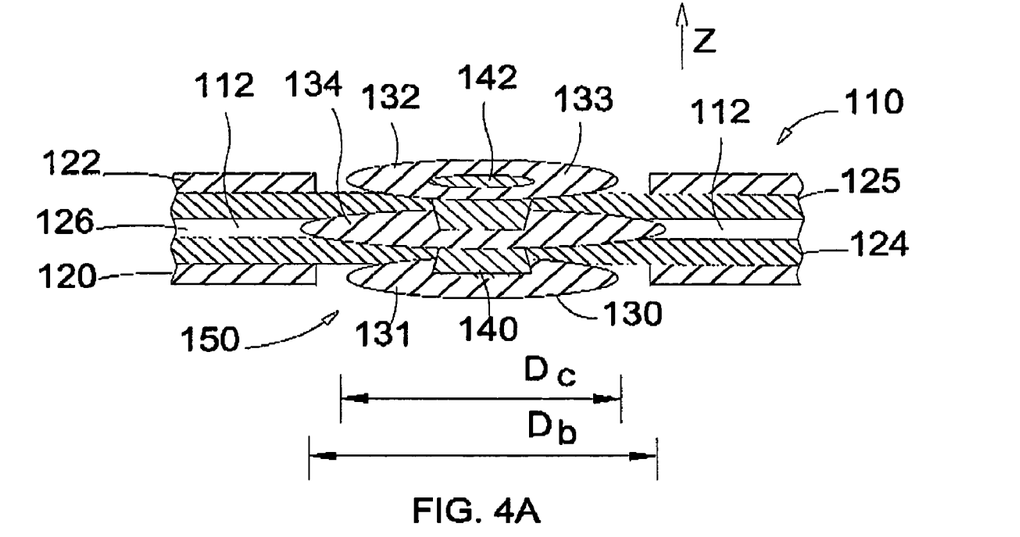
FIG. 4A is a perspective view of an interlayer interconnection unit within a pseudo three-layer core, according to one embodiment of the present invention.
Figure 5:
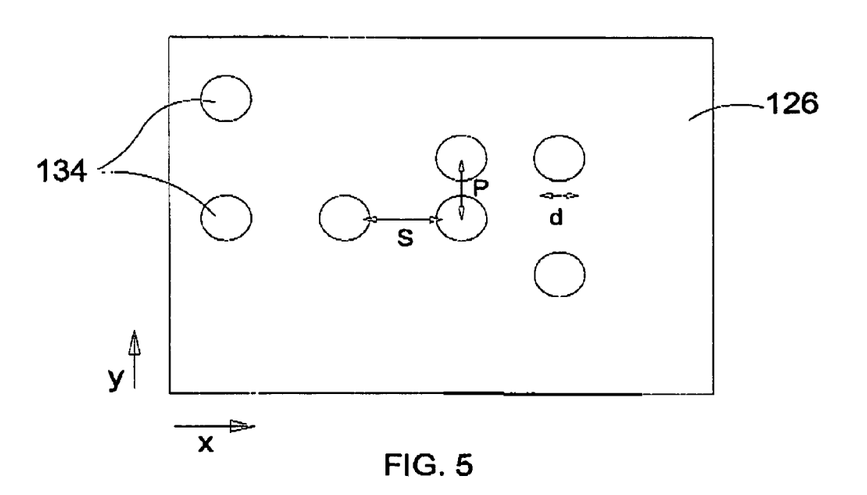
FIG. 5 is a plan view of a portion of a bridge layer of a carrier for a multilayer PCB, according to one embodiment of the present invention.

FIG. 4A shows an interlayer interconnection unit 150 within a three-layer core 110, with interlayer interconnection unit 150 shown in perspective view, according to one embodiment of the present invention. Three-layer core 110 may include an internal bridge layer 126 disposed between first dielectric layer 124 and second dielectric layer 125. Three-layer core 110 may further include first and second metal layers 120, 122, respectively, as described hereinabove.

Bridge layer 126 may comprise a plurality of spaced apart interstitial bridge pads 134. Each bridge pad 134 may comprise an essentially disc-shaped conductive element, e.g., a copper disc. Each bridge pad 134 may lack electrical connection to other bridge pads 134 within bridge layer 126. Interlayer interconnection unit 150 may include one bridge pad 134 located within bridge layer 126 (FIG. 5). That is to say, each bridge pad 134 may be a component of an interlayer interconnection unit 150.

Interlayer interconnection unit 150 may further include a first capture pad 130 within first metal layer 120, and a second capture pad 132 within second metal layer 122. First capture pad 130 and second capture pad 132 may each comprise a conductive (e.g., copper) element, which may be formed by the selective removal, e.g., by etching, of first metal layer 120 and second metal layer 122, respectively. It is apparent from FIG. 4A that bridge pad 134 may have a diameter, $D_b$, that is greater than a diameter, $D_c$, of first and second capture pads 130, 132. First Interlayer interconnection unit 150 may still further include a first blind via 140 and a second blind via 142. Each of first blind via 140 and second blind via 142 may be formed by a process such as laser drilling, plasma drilling, or photo-definition (photo-defining). Although FIG. 4A shows a gap 112 within bridge layer 126 on either side of bridge pad 134, during lamination first and second dielectric layers 124, 125 may fuse together such that bridge pad 134 may be encapsulated within first and second dielectric layers 124, 125.

During formation of interlayer interconnection unit 150, a first annular ring 131 may be formed within first metal layer 120. As an example, first annular ring 131 may comprise an annular, outer portion of first capture pad 130. Similarly, during formation of interlayer interconnection unit 150, a second annular ring 133 may be defined within second metal layer 122. As an example, second annular ring 133 may comprise an annular, outer portion of second capture pad 132. Each of first annular ring 131 and second annular ring 133 may comprise an annular conductive (e.g., copper) element.

After forming first and second blind vias 140, 142, respectively, first and second blind vias 140, 142 may be plated shut. In some embodiments, first and second blind vias 140, 142 may be plated shut using a µfill process, such as the MicroFill™ VF process of the Shipley Company, LLC (Marlborough, Mass.). Briefly, MicroFill™ VF is a direct current electrolytic copper plating process for filling blind vias, including vias. (See, for example, *MicroFill™ VF, Electrolytic Copper, Plating Technology for Filling Blind Microvias in HDI/Build-up Printed Wiring Boards*, Ref. No. PM02N006, Rev. No. 0, Copyright, 2002, Shipley Company, LLC (Marlborough, Mass.); and *MicroFill VF Process Manual*, Ref. No. PM03N002, Rev. No. 0, February, 2003, Shipley Company, LLC (Marlborough, Mass.), both of which are incorporated by reference herein).

Figure 4B:
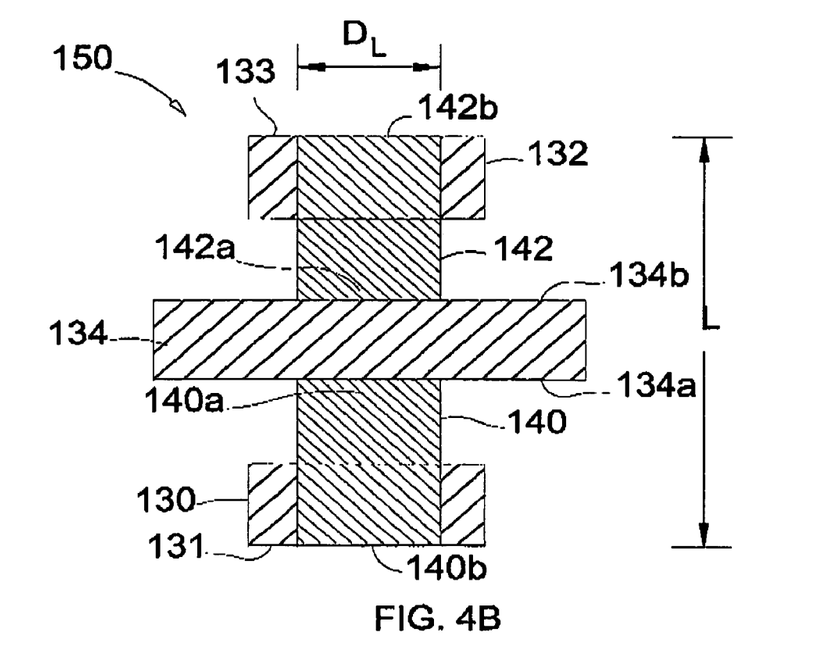
FIG. 4B is a side view of the interlayer interconnection unit of FIG. 4A, according to the present invention.

FIG. 4B is a side view of the interlayer interconnection unit of FIG. 4A, according to the present invention. First and second dielectric layers 124, 125 are omitted from FIG. 4B for the sake of clarity. As may be seen in FIGS. 4A-B, bridge pad 134 may include a first side 134a and a second side 134b. First blind via 140 may include a first via inner end 140a and a first via outer end 140b. Inner end 140a may be in electrical contact with bridge pad first side 134a, while outer end 140b may be in electrical contact with first capture pad 130 and encircled by first annular ring 131. Second blind via 142 may include a second via inner end 142a and a second via outer end 142b. Inner end 142a may be in electrical contact with bridge pad second side 134b, while outer end 142b may be in electrical contact with second capture pad 132 and encircled by second annular ring 133. First and second annular rings 131, 133, may be considered to be the remaining annular portion of first and second capture pads 130, 132, respectively, after formation of a hole therethrough. Thus, interlayer interconnection unit 150 may extend from first capture pad 130, through first blind via 140, bridge pad 134, second blind via 142, and thence to second capture pad 132.

Again with reference to FIGS. 4A-B, each of first and second blind vias 140, 142, respectively, may have an aspect ratio of about 1:1, and usually at least about 1:1. Because first and second blind vias 140, 142 are aligned in the z dimension, or coaxial with each other, interlayer interconnection unit 150 may have an effective aspect ratio of about 2:1, and often greater than 2:1. Thus, interlayer interconnection unit 150 of the instant invention allows for a greater than two fold (2×) increase in effective aspect ratio for interconnecting adjacent conductive layers of multilayer PCBs, as compared with the prior art. At the same time, because pseudo three-layer core 110 of the instant invention has two dielectric layers and two signal layers (as compared with only one dielectric layer in prior art two-layer cores) the total dielectric thickness (i.e., the combined thickness of first and second dielectric layers 124, 125) per signal layer (e.g., the mean thickness of first metal layer 120 and second metal layer 122) may be increased by about two fold in carriers of the present invention as compared with a prior art two-layer core. This increase in total dielectric thickness per signal layer is achieved without increasing the aspect ratio of each blind via, i.e., of first and second blind vias 140, 142. The effective aspect ratio of interlayer interconnection unit 150, as referred to herein, is the ratio of the length, L (FIG. 4B) (i.e., the z dimension) of interlayer interconnection unit 150 to the diameter, $D_v$ (FIG. 4B) of first and second blind vias 140, 142. The z axis is indicated in FIG. 4A by the vertical arrow labeled "z".

FIG. 5 is a plan view of a portion of a bridge layer 126 of a carrier for a multilayer PCB of the present invention. Bridge layer 126 may include a plurality of interstitial bridge pads 134. Each interstitial bridge pad 134 may comprise a metal, such as copper. The plurality of interstitial bridge pads 134 may be conveniently formed by etching one side of a copper clad dielectric layer 124 (e.g., FIGS. 11A-B).

Interstitial bridge pads 134 may be spaced apart from each other by a distance, S in the range of from about 0.7 to 4 mils, with a center-to-center pitch, P in the range of from about 15 to 25 mils. Each interstitial bridge pad 134 may have a diameter, d in the range of from about 12 to 20 mils, usually in the range of from about 14 to 17 mils, and often in the range of from about 15 to 16 mils. Interstitial bridge pads 134 typically lack electrical connectivity, within bridge layer 126, to other bridge pads 134, or to any other conductive element (e.g., a trace or a component) of bridge layer 126. That is to say, bridge layer 126 may consist of a plurality of spaced apart bridge pads 134, with no electrical connections therebetween within bridge layer 126.

FIG. 6 schematically represents a carrier 110' for a multilayer PCB, according to one embodiment of the present invention. Carrier 110' may include a pseudo three-layer core 110. As shown, carrier 110' may further include a first additional dielectric layer 124' and a first additional conductive layer 120' laminated thereto. Carrier 110' may still further include a second additional dielectric layer 125' and a second additional conductive layer 122' laminated thereto. In other embodiments of the invention (not shown in FIG. 6), carrier 110' may have fewer or more additional dielectric and conductive layers than those shown in FIG. 6 laminated to pseudo three-layer core 110.

As described hereinabove, pseudo three-layer core 110 may itself comprise two signal layers 120, 122. By adding additional conductive layers, e.g., layers 120', 122' to pseudo three-layer core 110, each carrier 110' may comprise from three to six or more conductive layers (only four conductive layers 120, 122, 120', and 122' are shown in FIG. 6). Each of layers 120, 122, 120', and 122', or of any other additional conductive layers (not shown in FIG. 6) of a carrier or multilayer PCB 100 may comprise a signal layer; or one or more conductive layers (e.g., layers 120, 122, 120', and 122', or other additional conductive layers) of a carrier or multilayer PCB 100 may comprise a plane or ground layer, as is well known in the art. Two or more carriers 110' may be combined (laminated) together (FIG. 2) to form a multilayer PCB having from four to 28 or more conductive layers (see, e.g., FIG. 6).

Figure 7:
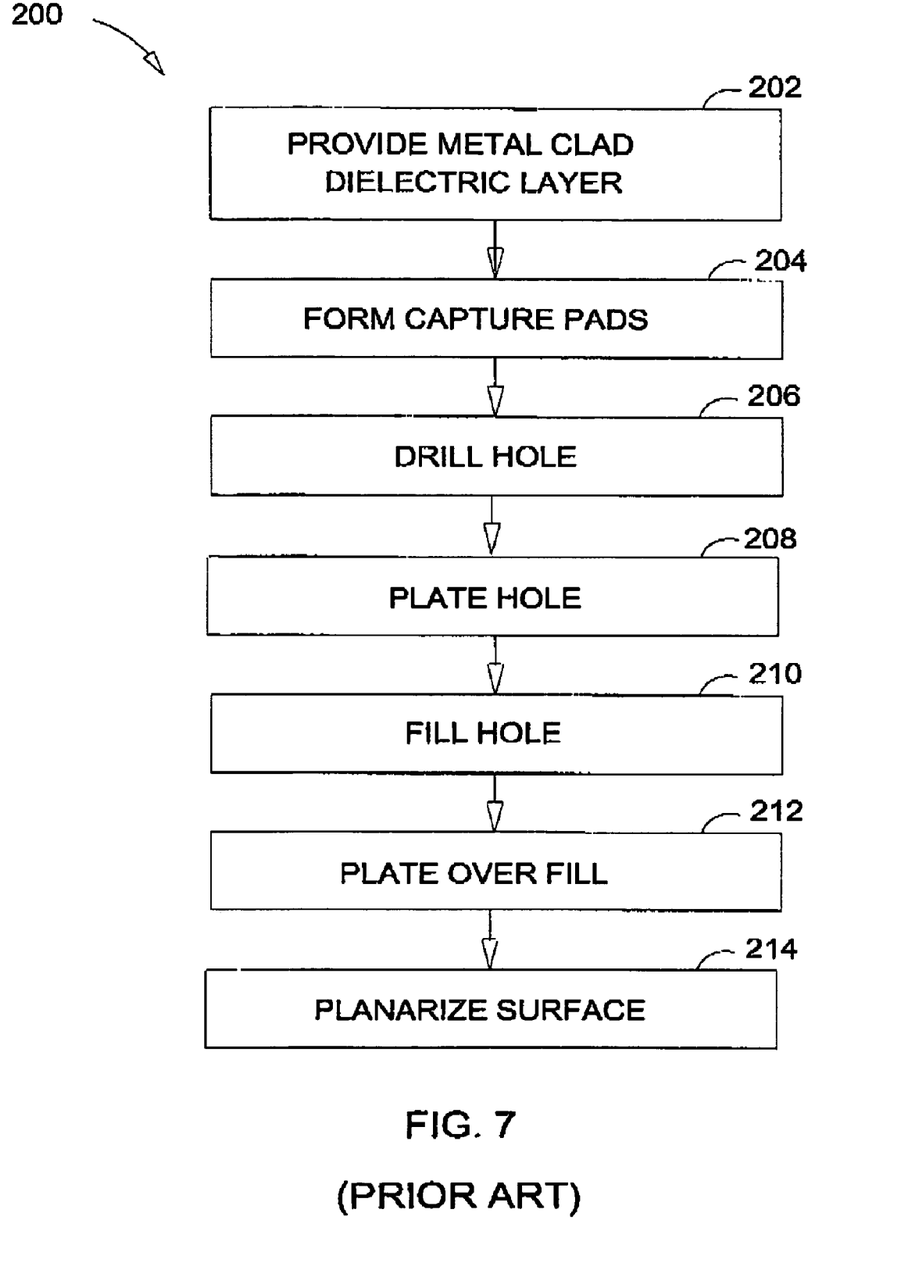
FIG. 7 schematically represents a series of steps involved in a method for making a conventional carrier for a multilayer PCB, according to the prior art.

FIG. 7 schematically represents a series of steps (202-214) involved in a method 200 for making a conventional carrier for a multilayer PCB, according to the prior art. Step 202 involves providing a metal clad dielectric layer, such as a layer of dielectric material having a layer of copper foil on each side. Due to production limitations associated with filling μvias of a defined diameter and aspect ratio in a thin dielectric layer, the minimum thickness of the dielectric layer in prior art PCBs is typically about 4 mils.

Step 204 involves forming pads (capture pads and target pads) on the copper layers by etching the copper foil. The formation of such pads is well known in the art. Due to the industry trend towards high-density interconnections, the diameter of current state of the art capture pads and target pads is typically limited to around 10 mils. In prior art processing, there may be difficulties in aligning the drill to pads of this size. In comparison, bridge pads 134 of the invention may have diameters, d up to about 20 mils or more. The larger diameter, d f bridge pads 134 of the invention is possible because the pseudo metal layer (or bridge layer) 126 of carriers of the invention may lack traces, components, or other conductive features. The larger diameter of bridge pads 134 of the invention offer the advantage of facilitating drill registration during via formation.

Step 206 involves drilling a hole though one or both of the copper layers and the dielectric layer, to form a blind via or a through hole. Step 208 involves plating the hole. Thereafter, step 208, which entails a first plating cycle of the prior art process, adds to the overall thickness of the surface copper. Step 210 involves filling the hole with electrically conductive material, such as a high solids epoxy. Filling the hole in this manner becomes impracticable for presently used dielectric thickness, hole diameter, and aspect ratio. Step 212 involves plating over the fill, in a second plating cycle, to provide a contiguous metal layer over the filled hole. Thus, step 212 further adds to the surface copper thickness.

Excessive thickness of surface copper may prevent etching of fine features. For example, for a PCB having a 3 mil line and space specification, a surface copper thickness of 1.4 mils or less may be required. Prior art processes that result in surface copper thickness greater than 1.4 mils may require additional processing steps to remove excess surface copper.

Step 214 of the prior art process involves planarizing the copper layer(s) in which holes have been drilled, plated, filled, and plated over. Planarizing may be accomplished by mechanical reduction of surface copper, which process may excessively stress the carrier. In situations, where surface copper exceeds the maximum permissible thickness, reduction of surface copper may damage or destroy the carrier or its components, leading to decreased manufacturing efficiency.

In contrast to the prior art, processes of the invention for making a multilayer PCB may use only one plating cycle. As a result, a total surface copper thickness of about 1 mil or less can be readily achieved. Lower total surface copper thickness decreases the amount of planarizing and mechanical reduction of surface copper, and allows finer line and space resolution.

Figure 8:
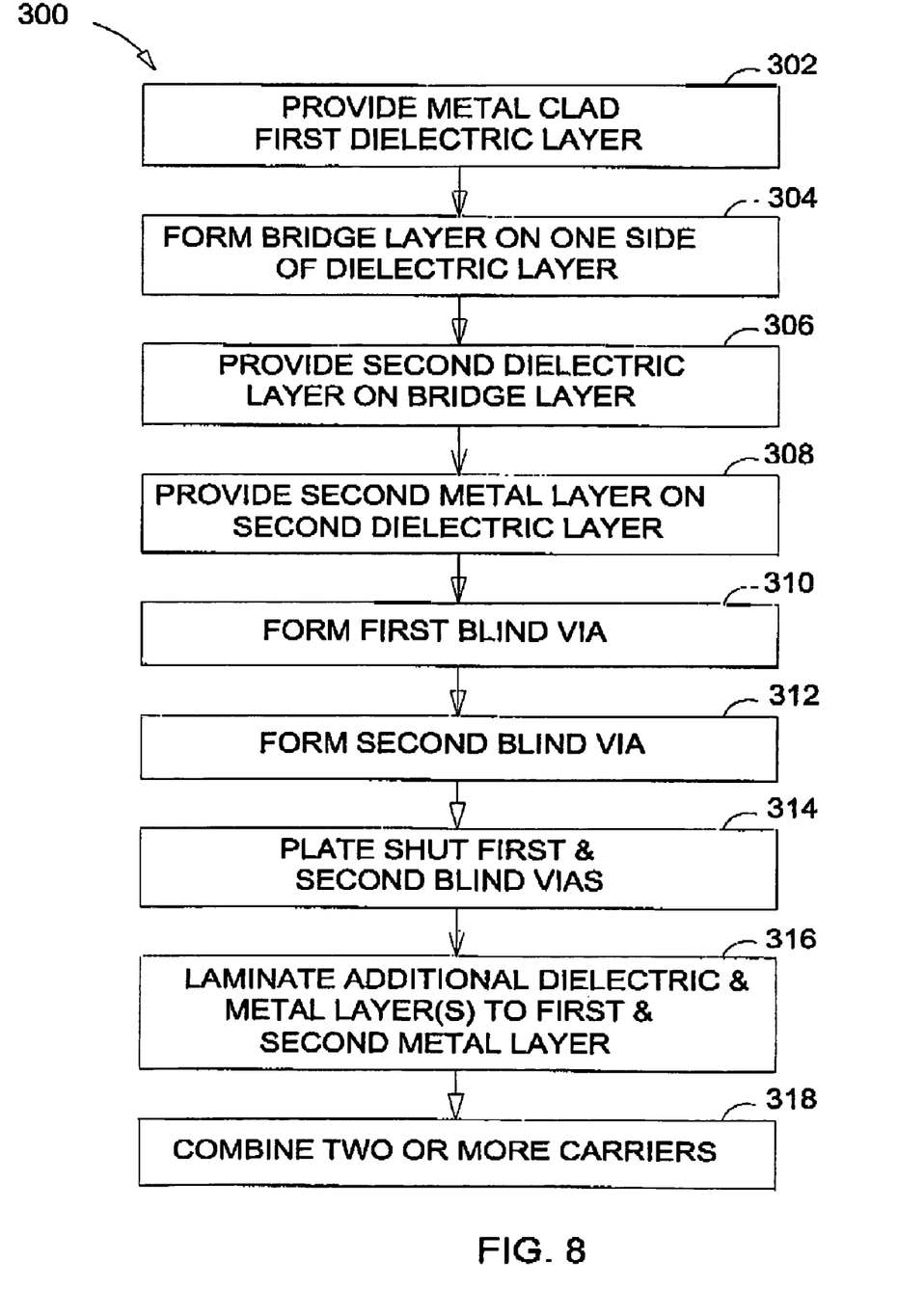
FIG. 8 schematically represents a series of steps involved in a method for making a multilayer PCB, according to another embodiment of the present invention.

FIG. 8 schematically represents a series of steps (302-318) which may be involved in a method 300 for making a multilayer PCB, according to one embodiment of the present invention. Step 302 may involve providing a metal clad first dielectric layer, such as a dielectric layer having a first side and a second side, and a layer of copper foil on both the first side and the second side. Step 304 may involve forming a bridge layer on one side of the dielectric layer. The bridge layer may comprise a plurality of spaced apart bridge pads, as described herein (FIGS. 4A-B, FIG. 5). The bridge layer may be formed by etching the copper foil on one side of the dielectric layer. Alternatively, the bridge pads and the bridge layer may be formed by building up from an exposed dielectric layer using an additive technology. The bridge layer formed during step 302 may be referred to as a pseudo metal layer.

Step 306 may involve providing a second dielectric layer disposed on the bridge layer. Step 308 may involve providing a second metal layer laminated to the second dielectric layer. Steps 306 and 308 may be combined into a single process in which a dielectric layer, which has been clad with the second metal layer, may be disposed on the bridge layer.

Step 310 may involve forming a first blind via, wherein the first blind via extends from the first metal layer, through the first dielectric layer, and to a first side of a bridge pad within the bridge layer. Step 312 may involve forming a second blind via from the second metal layer, through the second dielectric layer, and to a second side of the bridge pad within the bridge layer. Each of the first blind via and the second blind via 142 may be formed by a process such as laser drilling, plasma drilling, or photo-defining. Typically, the first blind via may emanate from a first capture pad of the first metal layer, and the second blind via may emanate from a second capture pad of the second metal layer. The first and second capture pads may be formed by etching the first and second metal layers, respectively.

Step 314 may involve plating shut the first and second blind vias, such that an interlayer interconnection unit may be formed within a multilayer carrier, wherein the interlayer interconnection unit may include a bridge pad disposed between the first and second blind vias (FIG. 4A). The first and second blind vias may be opposed to each other in the z dimension and coaxial with the bridge pad. The first and second blind vias may be plated shut in a single plating cycle using a μfill process, such as the MicroFill™VF process of the Shipley Company, LLC (Marlborough, Mass.), as referred to hereinabove.

Optional step 316 may involve laminating one or more additional dielectric layers, and one or more additional metal layers, to the first and second metal layers of the basic carrier or pseudo three-layer core formed by steps 302-314. In this way, a carrier having up to six or more signal layers may be formed. Optional step 318 can involve laminating together two or more carriers formed by steps 302-314, or by steps 302-316, to provide a multilayer PCB having from 4 to 28 or more signal layers.

Figure 9:
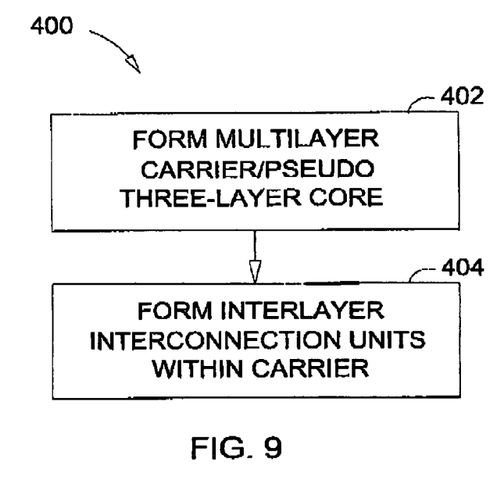
FIG. 9 schematically represents a series of steps involved in a method for making a multilayer PCB, according to yet another embodiment of the present invention.

FIG. 9 schematically represents a series of steps (402-404) involved in a method 400 for making a multilayer PCB, according to another embodiment of the present invention. Step 402 may involve forming a multilayer carrier or a pseudo three-layer core. A pseudo three-layer core formed according to step 402 may include two signal layers. In some embodiments, the multilayer carrier or pseudo three-layer core may be considered to be a sub-assembly for the multilayer PCB. For example, additional signal layers may be laminated to the pseudo three-layer core; or two or more pseudo three-layer cores may be laminated together to form a multilayer PCB having at least 4 signal layers. Step 404 may involve forming a plurality of interlayer interconnection units within the carrier for interconnecting two or more conductive layers of the carrier. Interlayer interconnection units of the invention were described hereinabove (e.g., with reference to FIGS. 4A-B). Formation of interlayer interconnection units of the invention is also described herein, for example, with reference to method 400 (FIG. 9).

Figure 10:
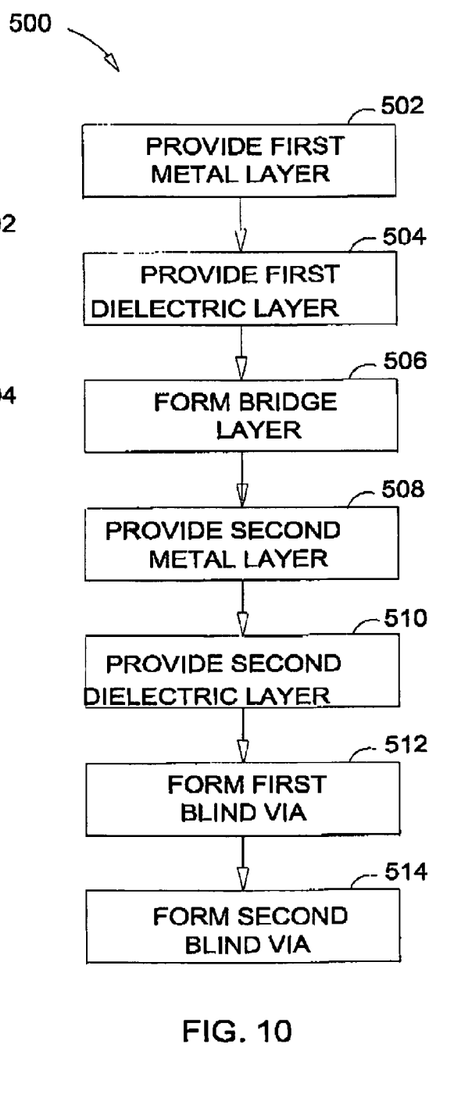
FIG. 10 schematically represents a series of steps involved in a method for making a carrier for a multilayer PCB, according to a further embodiment of the present invention.

FIG. 10 schematically represents a series of steps (502-514) involved in a method 500 for making a carrier for a multilayer PCB, according to another embodiment of the present invention, wherein step 502 may involve providing a first metal layer. Step 504 may involve providing a first dielectric layer. The first metal layer may be laminated to a first side of the first dielectric layer.

Step 506 may involve forming a bridge layer. Bridge layer, which may comprise a plurality of spaced apart bridge pads, may be formed by etching a layer of copper foil laminated to a second side of the first dielectric layer. Formation of the bridge layer is described elsewhere herein, for example, with reference to method 200 (FIG. 7).

Step 508 may involve providing a second dielectric layer. The second dielectric layer provided in step 508 may be laminated to the bridge layer, such that the bridge pads of bridge layer are encapsulated in dielectric material between the first and second dielectric layers. Step 510 may involve providing a second metal layer, which may be laminated to the second dielectric layer.

Step 512 may involve forming a first blind via of an interlayer interconnection unit, wherein the first blind via may be disposed between the first metal layer and a first side of a bridge pad. Step 514 may involve forming a second blind via of the interlayer interconnection unit, wherein the second blind via may be disposed between the second metal layer and a second side of the bridge pad. First and second blind vias formed on opposite sides of a bridge pad within a multilayer carrier are described hereinabove, e.g., with reference to FIGS. 4A-B and FIG. 7.

In method 500, first and second blind vias may be plated shut in a single plating cycle, for example, as described with reference to method 200 (FIG. 7). Use of a single plating cycle minimizes excessive build-up of surface copper, and therefore decreases the need for subsequent reduction of surface copper, as described hereinabove. Optionally, after forming and plating shut the first and second blind vias to form a pseudo three-layer core, one or more additional dielectric layers and metal layers may be laminated to the pseudo three-layer core (see, e.g., step 316 of method 300 (FIG. 8)).

Figure 11A:
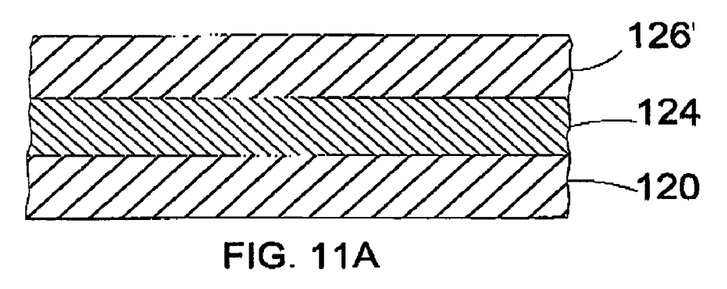
FIGS. 11A-E illustrate stages in a process for forming an interlayer interconnection unit for a multilayer PCB, according to one embodiment of the present invention.

FIGS. 11A-E illustrate stages in forming an interlayer interconnection unit for a multilayer PCB, according to one embodiment of the present invention. FIG. 11A shows a first dielectric layer 124 which can be clad on each side with a layer of copper foil, namely a first layer of copper foil 120 and a second layer of copper foil 126'. First dielectric layer 124 may also be referred to as a metal clad first dielectric layer 124 having a first metal clad side clad with a first layer of copper foil 120, and a second metal clad side clad with a second layer of copper foil 126'. The first layer of copper foil 120 may also be referred to herein as first metal layer 120. The second layer of copper foil 126' may be etched to form a bridge layer 126 (FIGS. 11B-E).

Figure 11B:
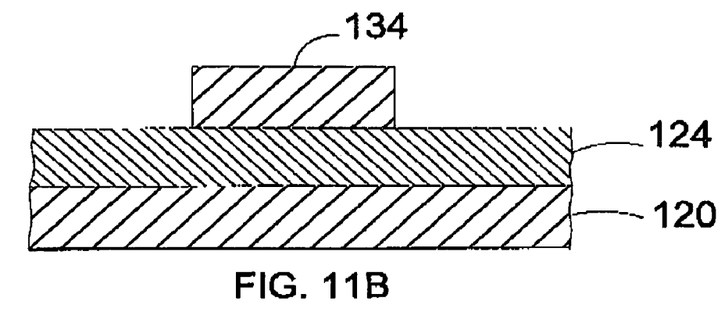

FIG. 11B shows a bridge pad 134, which may be formed by etching second layer of copper foil 126'. For the sake of clarity, FIGS. 11B-E show only one bridge pad 134 within bridge layer 126; however in practice, a much larger number of bridge pads may be formed within bridge layer 126.

Figure 11C:
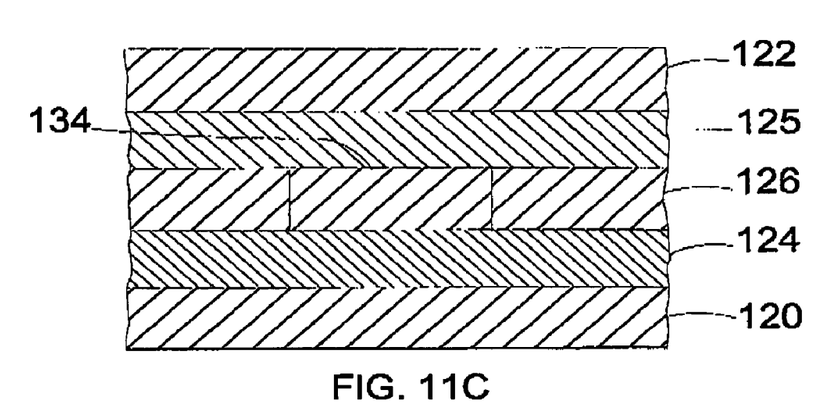

FIG. 11C shows the structure of FIG. 11B and which may have a second dielectric layer 125 and a second metal layer 122 laminated thereto. Although FIGS. 11C-E show a gap 112 within bridge layer 126 adjacent to bridge pad 134, during lamination first and second dielectric layers 124, 125 may fuse around bridge pad 134 such that bridge pad 134 may be encapsulated within first and second dielectric layers 124, 125.

Figure 11D:
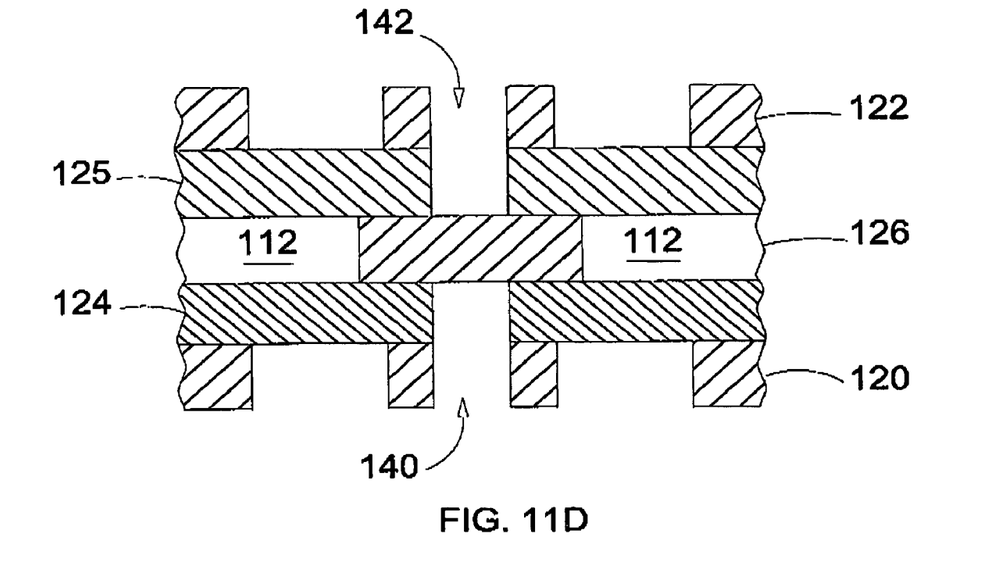

FIG. 11D illustrates the structure of FIG. 11C after etching first and second metal layers 120, 122, respectively to form capture pads 130, 132, respectively. FIG. 11D also shows a first blind via 140 and a second blind via 142. First and second blind vias 140, 142 can extend from first and second metal layers 120, 122, respectively, to first and second sides of bridge pad 134.

Figure 11E:
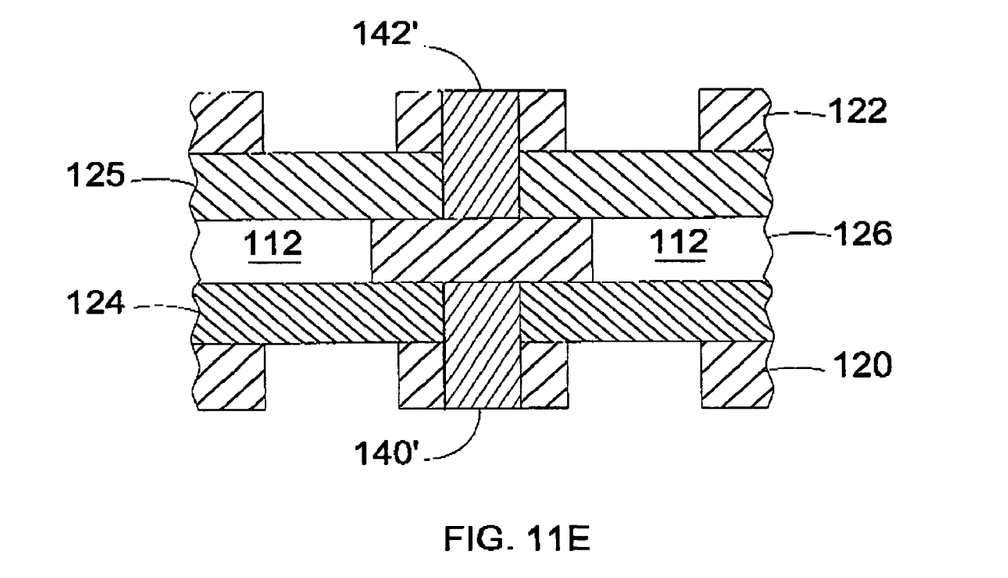

FIG. 11E shows the structure of FIG. 11D which may have solid first and second blind vias 140', 142' filled and plated shut to form interlayer interconnection unit 150 for interconnecting first and second metal layers 120, 122. An interlayer interconnection unit 150 of the invention has been described hereinabove. Briefly, interlayer interconnection unit 150 may include first capture pad 130, solid first blind via 140', bridge pad 134, solid second blind via 142', and second capture pad 132.

It should be understood, of course, that the foregoing relates to preferred embodiments of the invention and that modifications may be made without departing from the spirit and scope of the invention as set forth in the following claims.

The invention claimed is:

1. An interlayer interconnection unit for a printed circuit board (PCB), comprising:
    a plurality of interstitial bridge pads, each of said plurality of interstitial bridge pads having a first side and a second side, wherein said first side of each of said interstitial bridge pads physically contacts a first dielectric layer and said second side of each of said plurality of_interstitial bridge pads physically contacts a second dielectric layer;
    a corresponding first blind via disposed on said first side of each of said plurality of_interstitial bridge pads, wherein said first blind via extends through said first dielectric layer; and
    a corresponding second blind via disposed on said second side of each of said plurality of_interstitial bridge pads, wherein said second blind via extends through second dielectric layer, wherein each of said plurality of_interstitial bridge pads electrically connects corresponding first blind vias to corresponding second blind vias,
    wherein each of said plurality of interstitial bridge pads is coaxial in a z direction with said corresponding first blind via and with said corresponding second blind via,
    wherein, in between interstitial bridge pads, at least a portion of said first dielectric layer is fused to at least a portion of said second dielectric layer,
    said corresponding first blind vias extend from corresponding first capture pads to said first side of each of said plurality of interstitial bridge pads,
    said corresponding second blind vias extend from corresponding second capture pads to said second side of each of said plurality of interstitial bridge pads, and
    said corresponding first capture pad and said corresponding second capture pad each have a diameter less than a diameter of said interstitial bridge pad therebetween.

2. The interlayer interconnection unit of claim 1, wherein said interstitial bridge pad comprises a disc-shaped conductive element.

3. The interlayer interconnection unit of claim 1, wherein:
    said corresponding first blind via extends from a first conductive layer, through said first dielectric layer, and to said first side of each of said plurality of interstitial bridge pads, and
    said corresponding second blind via extends from a second conductive layer, through said second dielectric layer, and to said second side of each of said plurality of interstitial bridge pads.

4. The interlayer interconnection unit of claim 1, wherein said first conductive layer and said second conductive layer each comprise copper foil.

5. The interlayer interconnection unit of claim 1, wherein each of said plurality of interstitial bridge pads have a diameter in the range of from about 12 to 20 mils.

6. The interlayer interconnection unit of claim 1, wherein:
    said PCB comprises a bridge layer disposed between said first dielectric layer and said second dielectric layer, and
    each of said plurality of interstitial bridge pads are located within said bridge layer, and wherein each of said plurality of interstitial bridge pad lacks electrical connection, within said bridge layer, to a conductive element of said bridge layer.

7. A dual blind via interconnection unit for a multilayer PCB, comprising:
    a pair of opposed coaxial blind vias transversing a pair of dielectric layers; and
    at least one bridge pad disposed between said pair of blind vias, wherein each of said pair of dielectric layers is in physical contact with said bridge pad, and wherein said bridge pad is adapted to electrically interconnect said pair of opposed coaxial blind vias without electrically interconnecting any other blind vias,
    wherein a first bridge pad of said at least one bridge pad lacks electrical connectivity to others of said at least one bridge pads, and
    wherein each pair of opposed coaxial blind vias in said dual blind via interconnection unit are coaxial,
    said pair of opposed coaxial blind vias extend from a corresponding pair of capture pads, and
    each of said corresponding pairs of capture pads have a diameter less than a diameter of a corresponding one of said bridge pads.

8. The interconnection unit of claim 7, wherein said bridge pad has a diameter in the range of from about 12 to 20 mils.

9. The interconnection unit of claim 8, wherein each of said pair of blind vias has a diameter in the range of from about 4 to 6 mils.

10. A method for forming a multilayer printed circuit board (PCB), comprising:
   a) providing a metal clad first dielectric layer having a first metal clad side and a second metal clad side;
   b) forming a bridge layer from said second metal clad side, wherein said bridge layer comprises a plurality of bridge pads disposed on said first dielectric layer, and wherein said first metal clad side comprises a first metal layer;
   c) providing a second dielectric layer disposed on said bridge layer, wherein said second dielectric layer has a second metal layer disposed thereon;
   d) forming a first blind via through said first dielectric layer, wherein said first blind via extends from said first metal layer to a first side of at least one of said plurality of bridge pads; and
   e) forming a second blind via through said second dielectric layer, wherein said second blind via extends from said second metal layer to a second side of said at least one of said plurality of bridge pads,
   wherein said each of said bridge pad is coaxial in a z direction with a corresponding one of said first blind via and with a corresponding one of said second blind via, and
   wherein, in the absence of an interstitial bridge pad therebetween, at least a portion of said first dielectric layer is fused to at least a portion of said second dielectric layer, and
   said corresponding one of said first blind via extends from a corresponding first capture pad to a first side of each of said bridge pads,
   said corresponding one of said second blind via extends from a corresponding second capture pads to a second side of each of said bridge pads, and
   said corresponding first capture pad and said corresponding second capture pad each have a diameter less than a diameter of said bridge pad therebetween.

11. The method of claim 10, wherein said step b) comprises etching said second metal clad side of said first dielectric layer to form said at least one of said plurality of bridge pads.

12. The method of claim 10, wherein:
   said second metal clad side comprises copper foil, and
   wherein said at least one of said plurality of bridge pads comprises copper.

13. The method of claim 10, wherein each of said plurality of bridge pads has a diameter in the range of from about 12 to 20 mils.

14. The method of claim 10, wherein said bridge layer lacks electrical connectivity between said plurality of bridge pads.

15. The method of claim 10, wherein said steps c) and d) respectively comprise forming said first blind via and said second blind via by a process selected from the group consisting of laser drilling, plasma drilling, and photo-defining.

16. The method of claim 10, further comprising:
   e) plating shut said first blind via and said second blind via.

17. The method of claim 16, wherein after said step e), said first metal layer and said second metal layer each have a thickness in the range of from about 0.8 to 1.4 mils.

18. The method of claim 16, wherein after said step e) said first metal layer and said second metal layer each have a thickness in the range of from about 0.9 to 1.1 mils.

19. The method of claim 10, wherein said method involves only a single plating cycle.

20. The method of claim 10, wherein said first blind via and said second blind via each comprise a μvia having a diameter in the range of from about 4 to 5 mils.

21. A method for forming a multilayer printed circuited board (PCB), comprising:
   a) forming a pseudo three-layer core, said pseudo three-layer core including:
      a first metal layer;
      a first dielectric layer disposed on said first metal layer,
      a plurality of spaced apart interstitial bridge pads disposed on said first dielectric layer;
      a second dielectric layer disposed on said plurality of spaced apart interstitial bridge pads; and
      a second metal layer disposed on said second dielectric layer; and
   b) forming a plurality of interlayer interconnection units for interconnecting said first metal layer and said second metal layer, wherein each of said interlayer interconnection units includes:
      a first blind via disposed on a first side of one of said plurality of interstitial bridge pads, wherein said first blind via extends from said first metal layer through said first dielectric layer; and
      a second blind via disposed on a second side of one of said plurality of interstitial bridge pads, wherein said second blind via extends from said second metal layer through said second dielectric layer, wherein said interstitial bridge pad is coaxial in a z direction with said first blind via and with said second blind via, and wherein each of said interlayer interconnection units include coaxially formed corresponding first blind vias and second blind vias, and
      said first blind via extends from a corresponding first capture pad to a first side of each of said plurality of interstitial bridge pads,
      said second blind via extends from a corresponding second capture pads to a second side of each of said plurality of interstitial bridge pads, and
      said corresponding first capture pad and said corresponding second capture pad each have a diameter less than a diameter of said interstitial bridge pad therebetween.

22. The method of claim 21, wherein:
   said step b) comprises plating shut said first blind via and said second blind via, and
   said method includes only a single plating cycle.

23. The method of claim 21, wherein each of said first blind via and said second blind via has an aspect ratio of at least about 1:1.

24. The method of claim 23, wherein each of said interlayer interconnection units has an effective aspect ratio of at least about 2:1.

25. A method for forming a multilayer printed circuit board (PCB), comprising:
   a) a step for forming a pseudo three-layer core, wherein said pseudo three-layer core includes:
      a first metal layer;
      a first dielectric layer disposed on said first metal layer;
      a plurality of bridge pads disposed on said first dielectric layer;
      a second dielectric layer disposed on said bridge pads; and
      a second metal layer disposed on said second dielectric layer; and
   b) a step for forming a plurality of interlayer interconnection units for electrically interconnecting said first metal layer and said second metal layer, wherein each of said interlayer interconnection units includes:
      a pair of opposed coaxial blind vias, and one of said plurality of bridge pads disposed between, and in electrical contact with, said pair of blind vias, wherein each pair of opposed coaxial blind vias in each of said plurality of interlayer interconnection units are coaxial, said pair of opposed coaxial blind vias extend from a corresponding pair of capture pads, and each of said corresponding pairs of capture pads have a diameter less than a diameter of a corresponding one of said bridge pads.

26. A method for forming a pseudo three-layer core for a PCB, comprising:

a) providing a first metal layer;
b) providing a first dielectric layer on said first metal layer;
c) forming a plurality of bridge pads on said first dielectric layer;
d) providing a second dielectric layer on said plurality of bridge pads;
e) providing a second metal layer on said second dielectric layer;
f) forming a first blind via on a first side of each of said plurality of bridge pads, wherein said first blind via extends from said first metal layer through said first dielectric layer; and
g) forming a second blind via on a second side of each of said plurality of bridge pads, wherein said second blind via extends from said second metal layer through said second dielectric layer, wherein each of said plurality of bridge pads is coaxial in a z direction with said first blind via and with said second blind via, said first blind via extends from a corresponding first capture pad to a first side of each of said plurality of bridge pads, said second blind via extends from a corresponding second capture pads to a second side of each of said plurality of bridge pads, and said corresponding first capture pad and said corresponding second capture pad each have a diameter less than a diameter of said bridge pad therebetween.

27. The method of claim 26, wherein:

said first dielectric layer comprises a first side and a second side, said first side having said first metal layer disposed thereon, and said second side having a layer of copper foil disposed thereon, and said step c) comprises etching said layer of copper foil.

28. An apparatus for forming a pseudo three-layer core for a PCB, comprising:

a) means for providing a first metal layer;
b) means for providing a first dielectric layer on said first metal layer;
c) means for forming a plurality of bridge pads on said first dielectric layer;
d) means for providing a second dielectric layer on said plurality of bridge pads;
e) means for providing a second metal layer on said second dielectric layer;
f) means for forming a first blind via on a first side of each of said plurality of bridge pads, wherein said first blind via extends from said first metal layer through said first dielectric layer; and
g) means for forming a second blind via on a second side of each of said plurality of bridge pads, wherein said second blind via extends from said second metal layer through said second dielectric layer, wherein each of said plurality of bridge pads is coaxial in a z direction with said first blind via and with said second blind via, said first blind via extends from a corresponding first capture pad to a first side of each of said plurality of bridge pads, said second blind via extends from a corresponding second capture pads to a second side of each of said plurality of bridge pads, and said corresponding first capture pad and said corresponding second capture pad each have a diameter less than a diameter of said bridge pad therebetween.

* * * * *